United States Patent [19]

Nakagawa

[11] Patent Number: 5,209,964
[45] Date of Patent: May 11, 1993

[54] CONDUCTIVE SHEET FOR SHIELDING ELECTROMAGNETIC WAVES

[75] Inventor: Asaharu Nakagawa, Yokkaichi, Japan

[73] Assignee: Kitagawa Industries Co., Ltd., Japan

[21] Appl. No.: 766,046

[22] Filed: Sep. 26, 1991

[30] Foreign Application Priority Data

Nov. 20, 1990 [JP] Japan .................. 2-314886

[51] Int. Cl.$^5$ .............................................. D03D 3/00
[52] U.S. Cl. ............................ 428/225; 428/35.3; 428/193; 428/257
[58] Field of Search ........... 428/36.1, 36.3, 225, 428/193, 257, 35.3; 174/51

[56] References Cited

U.S. PATENT DOCUMENTS

| | | | |
|---|---|---|---|
| 4,281,211 | 7/1981 | Tatum et al. | 174/36 |
| 4,668,545 | 5/1987 | Lowe | 428/36 |
| 4,791,236 | 12/1988 | Klein et al. | 428/36 |
| 4,946,722 | 8/1990 | Moyer | 428/36.3 |

FOREIGN PATENT DOCUMENTS

| | | |
|---|---|---|
| 381699 | 8/1991 | Japan . |
| 878893 | 10/1961 | United Kingdom . |
| 2005310 | 4/1979 | United Kingdom . |
| 2089851 | 6/1982 | United Kingdom . |
| 2155686 | 9/1985 | United Kingdom . |
| 86/03050 | 5/1986 | World Int. Prop. O. . |

*Primary Examiner*—James J. Bell
*Attorney, Agent, or Firm*—Davis, Bujold & Streck

[57] ABSTRACT

A conductive sheet for shielding electromagnetic waves of this invention has high flexibility in the same direction as a wire. The conductive sheet 10, therefore, is easy to bend along the shape of the wire. Additionally, since conductive sheet 10 preferably maintains its shape in a direction perpendicular to the wire, it is possible to make a conductive link, that is, to make an electrical contact easily, only by applying slight pressure to conductive sheet 10 to change its shape. Moreover, since the metals composing the warp and the weft of the conductive sheet keep the potential difference of the metals below a predetermined voltage at the contact point of both metals, contact corrosion as a practical problem at the predetermined point is eliminated.

18 Claims, 3 Drawing Sheets

CONDUCTIVE SHEET FOR SHIELDING ELECTROMAGNETIC WAVES

BACKGROUND OF THE INVENTION

This invention relates to a conductive sheet for shielding electromagnetic waves, for protecting electrical wires from the effects of electromagnetic waves outside the confines of the wire, and for preventing the leaking of electromagnetic waves that are generated within an electrical wire.

Conventionally, as a conductive sheet for shielding electromagnetic waves, for protecting electrical wires from generated electromagnetic waves, and for preventing the leaking of electromagnetic waves that are generated in the wire, the lamination of a conductive layer and an insulating synthetic resin sheet is well known. The conductive layer forms a cylindrical interwoven component of a metal foil or wire, for example, an aluminum foil.

One requirement for a shielding member of an electrical wire is shielding. In order to protect the wire from electromagnetic waves, or to prevent electromagnetic waves generated within the wire from leaking, the wire must be wound with a conductive layer, both edges of said conductive layer must be contacted electrically to form a cylindrical shape, and the conductive layer must be electrically grounded. The conventional member used to shield electromagnetic waves can not electrically ground both edges of the conductive layer without additional means. The cylindrical interwoven component of a metal wire tends to revert to its forms linear shape, and fails to keep a cylindrical shape. Further, a metal foil such as an aluminum foil and the like is so rigid that the contact area of both edges can not be significant.

Another requirement for the shielding member of an electrical wire is high flexibility, especially so in the same direction as that of the flexibility of the wire. However, the lamination of the cylindrical interwoven component of a metal foil or wire and the insulating synthetic resin sheet of the known design do not always have preferable flexibility in the same direction as the wire.

SUMMARY OF THE INVENTION

The object of this invention is to provide a conductive sheet which can contact both edges thereof electrically, and maintain high flexibility in the same direction as the wire.

To attain this or other object, this invention provides a conductive sheet for shielding electromagnetic waves from a wire.

In a conductive sheet, warp running in the same direction as the wire comprises at least a plurality of conductive thread strands plated with metal on a surface of fiber.

Weft, running in a direction perpendicular to the wire, comprises at least a plurality of wire segments composed of a metal which will not cause contact corrosion when placed in contact with the metal of the warp.

The warp and the weft are interwoven so as to form a conductive sheet for shielding electromagnetic waves.

The interwoven conductive sheet for shielding electromagnetic waves, containing the warp and weft, is wound around a wire for shielding purposes. After the conductive sheet is wound around the wire by overlapping both edges of the conductive sheet by a small amount, by a minor compression of the edges, both edges are placed in electrical contact and remain in contact without further compression. The warp comprises fiber having very high flexibility to easily adhere to the wire, and is wound along the wire in the same axial direction as the wire. Furthermore, if the metal composing the warp contacts the metal composing the weft of the conductive sheet, contact corrosion will not result due to the selected combination of the two metals.

DETAIL DESCRIPTION OF PREFERRED EMBODIMENT

Figure 1:
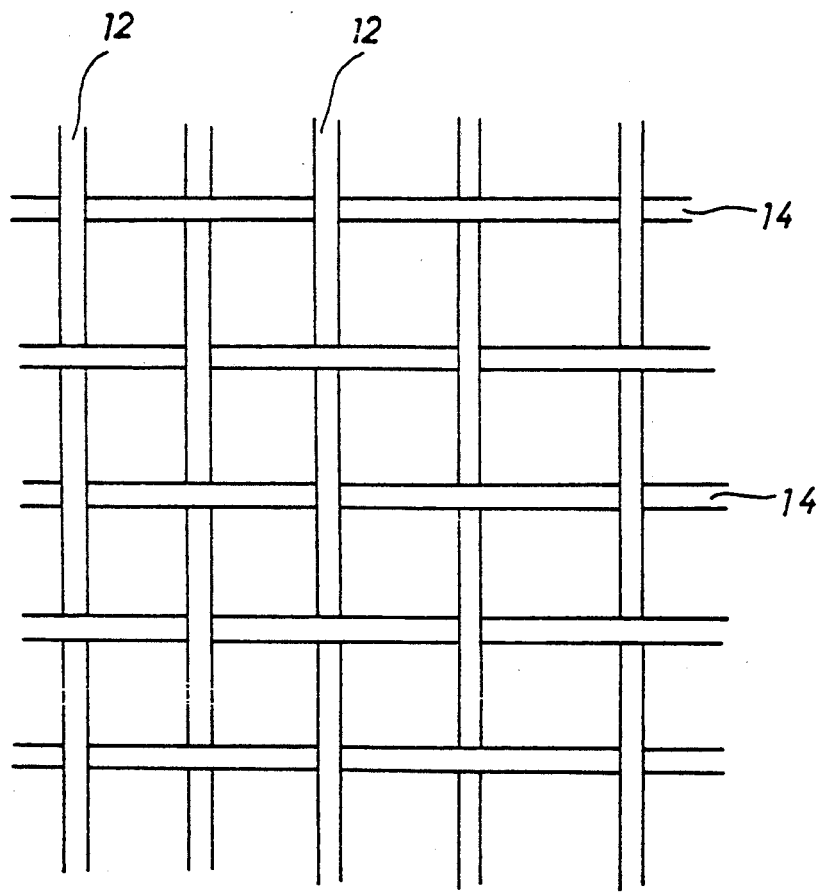
FIG. 1 is an illustration showing the interwoven condition of the conductive thread and the metal wire comprising a conductive sheet.

Hereinafter, an embodiment of this invention will be explained with reference to the drawings.

A conductive sheet 10 for shielding electromagnetic waves is interwoven of a conductive thread 12 and a metal wire 14. Conductive thread 12 is a warp running in the same axial direction as electrical wire 1, and metal wire 14 is a weft running in a direction perpendicular to electrical wire 1 when wire 1 is shielded by conductive sheet 10. Conductive threads 12 are plated with a conductive metal, such as copper, tin and the like, on the surface of a flexible synthetic fiber. The thickness of the metal plating is typically 0.5–10 $\mu$, but preferably is 1–5 $\mu$, since conductive thread 12 requires high flexibility in that not only is conductive sheet 10 wound around wire 1, but also must be able to exclude electromagnetic waves. Metal wire 14 is made of, for example, conductive copper and the like in a wire shape, so that metal wire 14 does not regain its original linear shape when conductive sheet 10 is wound around wire 1. Moreover, it is easier to plastically deform wire 14 to keep its as wound shape than to attempt to deform conductive thread 12.

As explained above, since the warp requires flexibility and must also exclude electromagnetic waves, the warp needs to be comprised substantially by conductive thread 12. Further, since the weft must hold the wound shape and also exclude electromagnetic waves, it is necessary that a substantial portion of the weft be formed from wire 14. Therefore, the weft should comprise the metal wire 14 and the warp should comprise conductive thread 12, though some intermixing of each is acceptable.

As considering from the above mentioned property, the diameter of the metal wire 14 as used either the warp and/or weft is preferably 50–500 $\mu$m $\phi$, and the number of metal wire segments 14 is 10–50 per cm used in a direction perpendicular to wire 1, and 5–30 per cm used in the same direction as wire 1.

The metal plating conductive thread 12 as the warp and the metal composing the metal wire 14 as the weft are both conductive. Typically, at a contact point, when voltage is generated to a predetermined value or greater, contact corrosion may result. To prevent this, a proper combination of metals to be used is required. As a result of experiments, it has been determined that when the potential difference of both metals used is 0.2 V or less at the contact point, no contact corrosion results. Therefore, in this embodiment, in order to keep a potential difference of 0.2 V or less at the contact point a metal combination per those listed in Table 1 should be selected.

TABLE 1

| | Metal Combination |
|---|---|
| | Metal which can be combined |
| Silver | Nickel, Monel, Copper nickel Alloy, Titanium |
| Nickel | Silver, Copper, 18 Stainless, Bronze, Brass, Nichrome |
| Monel | |
| Copper | Silver, Nickel, Monel 18% Stainless 12% Stainless Tin, Chrome |
| Tin | Bronze, Brass |
| Chrome | 18% Stainless Steel Chrome plating |

Figure 4:
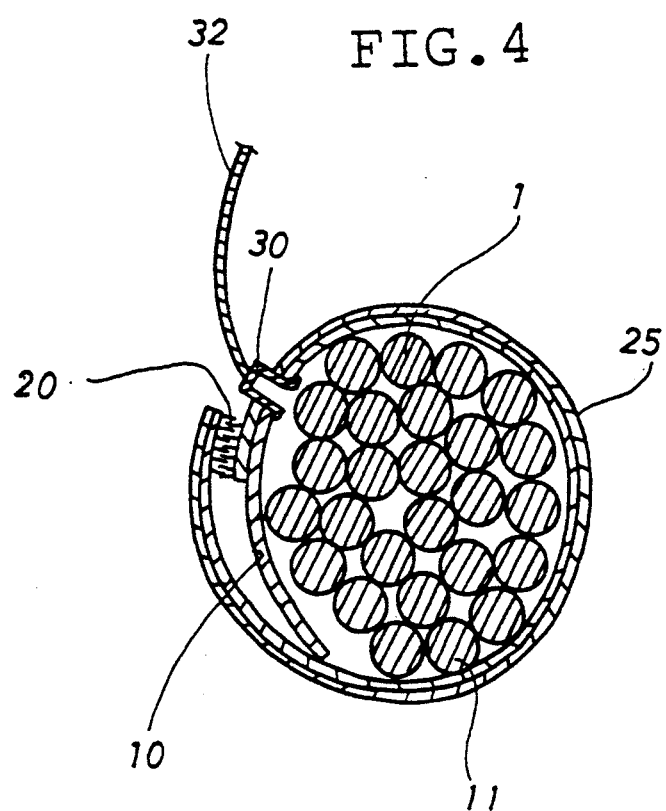
FIG. 4 is a cross-sectional view showing the shielding condition of a wire bundle.

Table 1 shows the metal used for metal wire 14 in the left column, and the metal used for conductive thread 12 in the right column. A surface fastener 20 is provided on both sides of conductive sheet 10, as shown in FIG. 4, to hold an as wound shape when conductive sheet 10 is cylindrically wound around the wire bundle 11. Surface fasteners 20, provided on either side of conductive sheet 10 engage when conductive sheet 10 is wound.

In this embodiment, a surface fastener 20 is used; however, any fastener other than surface fastener 20, can be used, if it can at least hold the as wound cylindrical shape of conductive sheet 10. For example, a hook or the like could be provided on both sides of conductive sheet 10, or alternately, a clip or the like, could be provided separate from conductive sheet 10. A waterproof cloth 25 is provided onto one side of conductive sheet 10, and the edges thereof are interwoven with a thread (not shown). The waterproof cloth 25 is insulated, and can also prevent water and oil.

Figure 2:
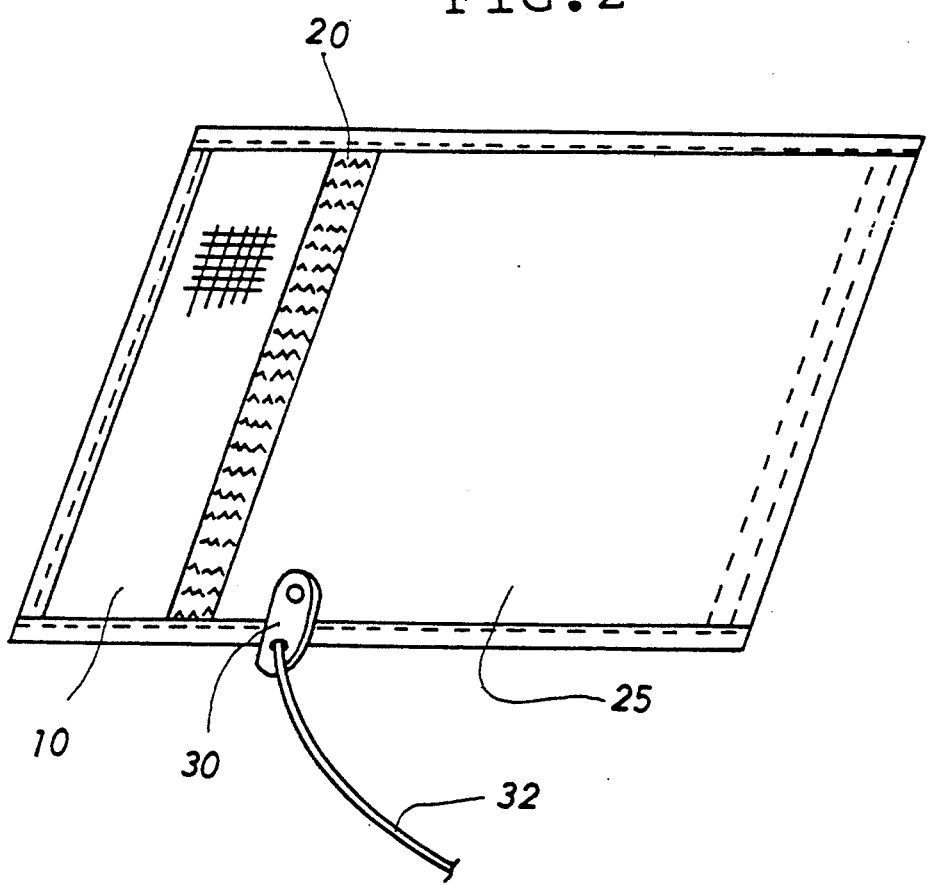
FIG. 2 is a perspective view of a conductive sheet for shielding electromagnetic waves.
Figure 3:
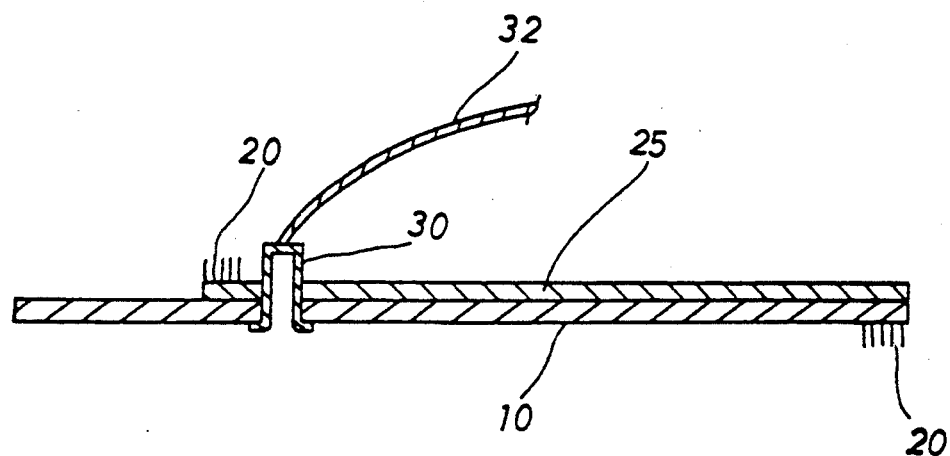
FIG. 3 is a cross-sectional view of the conductive sheet for shielding electromagnetic waves.

In this embodiment, as shown in FIG. 2, a waterproof cloth 25 is provided onto one side of conductive sheet 10. The inclusion of waterproof cloth 25, however, is optional and can be omitted from conductive sheet 10. A ground terminal 30 is also provided at the edge of conductive sheet 10 so as to release electromagnetic waves that are collected by conductive sheet 10. A ground wire 32 is soldered to ground terminal 30. However, in lieu of this arrangement, ground wire 32 could alternately be soldered directly to conductive sheet 10.

Subsequently, the operation of conductive sheet 10, mentioned above, will now be explained.

As shown in FIG. 4, conductive sheet 10 is cylindrically wound around the wire bundle 11 with waterproof cloth 25 forming an exterior surface. Subsequently, conductive sheet 10 is compressed slightly. The weft is wound in a direction perpendicular to wire 1, and keeps the as wound shape, meaning that it will not try to regain its original shape. The warp adheres along wire 1. Therefore, conductive sheet 10 stays around wire 1, so that equipment or other means required to hold the as wound shape are not needed. Finally, surface fasteners 20, provided onto both sides of formed conductive sheet 10 are engaged, thereby keeping conductive sheet 10 wound. In this condition, conductive sheet 10 gathers and releases electromagnetic waves from ground wire 32.

In this embodiment, each warp and weft of conductive sheet 10 is constructed as above, and surface fasteners 20 are provided onto both sides of conductive sheet 10, so that conductive sheet 10 can have electrical contact easily. Also, since the warp comprises fiber, it has high flexibility in the same axial direction as the wire. Further, when the potential difference of the contact point of the metal covering the surface of the fiber comprising the warp and the metal composing the weft sets at a predetermined voltage or less, and conductive sheet 10 is bent substantially in a cylindrical shape, conductive sheet 10 does not erode, since waterproof cloth 25 is provided onto the outer surface of conductive sheet 10. In addition, since ground wire 32 is attached onto conductive sheet 10, electromagnetic waves are released.

This invention is not limited to the described embodiment, in that it should be understood that various changes, adaptations and modifications may be made therein without departing from the spirit of the invention and the scope of the appended claims.

What is claimed is:

1. A conductive sheet for forming a sleeve wrappable around at least one electric wire, for shielding electromagnetic waves from said at least one electric wire comprising:
a warp running in the axial direction of the at least one electric wire and comprising at least a plurality of coaxial conductive thread strands made from a fibrous substance having flexibility in the axial direction of said strands and said at least one electric wire; and
a weft running in a direction perpendicular to the axis of the wire and the warp, and comprising at least a plurality of metal wires, wherein said warp and said weft are interwoven so as to form a continuous sheet which may be wrapped to form a sleeve around said at least one electric wire.

2. A sheet according to claim 1 wherein the conductive thread is plated with a conductive material.

3. A sheet according to claim 2 wherein the materials comprising the warp and weft do not cause surface corrosion upon contact with one another.

4. A sheet according to claim 3 wherein the metal comprising the wrap is selected from the group consisting of nickel, monel, copper-nickel alloy and titanium, and the conductive material comprising the weft is silver.

5. A sheet according to claim 3 wherein the metal comprising the warp is selected from the group consisting of silver, copper 18 stainless steel, bronze, brass and nichrome and the metal comprising the weft is selected from the group consisting of nickel and monel.

6. A sheet according to claim 3 wherein the metal comprising the warp is selected from the group consisting of silver, nickel, monel, 18 stainless steel, 12 stainless steel, tin and chrome and the metal comprising the weft is copper.

7. A sheet according to claim 3 wherein the metal comprising the warp is selected from the group consisting of bronze, brass, 18 stainless steel, and plated chrome and the weft is selected from the group consisting of tin and chrome.

8. A sheet according to claim 1 wherein the sheet is wound about a plurality of axially extending electric wires comprising a wire bundle such that two edges of said sheet extending in the direction of the wire overlap to provide a substantially cylindrical cross section.

9. A conductive sheet for forming a sleeve wrappable around at least one electric wire, for shielding electromagnetic waves from said at least one electric wire comprising:

a warp running in the axial direction of the at least one electric wire and comprising at least a plurality of coaxial conductive thread strands made from a fibrous substance having flexibility in the axial direction of said strands and said at least one electric wire;

a weft running in a direction perpendicular to the axis of the wire and the warp, and comprising at least a plurality of metal wires, wherein said warp and said weft are interwoven so as to form a continuous sheet which may be wrapped to form a sleeve around said at least one electric wire; and two edges of said sheet extending axially of the wire and wherein the sheet is wrapped around the at least one electric wire to provide a substantially cylindrical shield.

10. A sheet according to claim 9 wherein fastener means are attached to either side of said sheet and positioned so that upon engagement, said fasteners will retain the cylindrical shape of said conductive sheet.

11. A sheet according to claim 10 wherein a sheet of waterproof material is disposed onto at least one side of said sheet.

12. A sheet according to claim 11 wherein the sheet of waterproof material is composed of an insulating material.

13. A sheet according to claim 1 further comprising means to release electromagnetic waves collected by the sheet.

14. A conductive sheet for forming a sleeve wrappable around at least one electric wire, for shielding electromagnetic waves from said at least one electrical wire comprising:

a warp running in the same axial direction as the at least one electric wire comprising at least a plurality of conductive thread fibers plated with metal;

a weft running in a direction perpendicular to the at least one electrical wire comprising at least a plurality of metallic wires made from a material which will not cause corrosion when said metallic wires contact the metal of the warp, wherein the warp and weft are interwoven to form a flexible sheet and bendable about the axis of said wire bundle so as to form a substantially cylindrical cross-section;

fastener means attached to a top and bottom surface of said sheet which engages when said sheet is formed into a cylindrical shape, and when engaged causes said sheet to retain said formed shape, and an interconnected means to release electromagnetic waves collected by said sheet.

15. A sheet according to claim 1 wherein the diameter of the metal wire comprising the weft is preferably about 50 to about 500 Nmo.

16. A sheet according to claim 1 wherein the spacing of the metallic wires comprising the weft is preferably about 10 to about 50 wires per cm.

17. A sheet according to claim 3 wherein the potential difference of each metal comprising the warp and the weft is less than 0.2 v.

18. A sheet according to claim 14 wherein the release means comprising a ground wire attached by means to the conductive sheet.

* * * * *